(12) United States Patent
Chen

(10) Patent No.: US 7,612,441 B1
(45) Date of Patent: Nov. 3, 2009

(54) IMAGE-SENSING CHIP PACKAGE MODULE ADAPTED TO DUAL-SIDE SOLDERING

(75) Inventor: Meng-Kun Chen, Fongshan (TW)

(73) Assignee: Lite-On Semiconductor Corp., Taipei Hsien (TW)

( * ) Notice: Subject to any disclaimer, the term of this patent is extended or adjusted under 35 U.S.C. 154(b) by 8 days.

(21) Appl. No.: 12/149,546

(22) Filed: May 5, 2008

(51) Int. Cl.
*H01L 23/02* (2006.01)

(52) U.S. Cl. .................. 257/678; 257/433; 257/434; 257/432; 257/680; 257/698; 257/E23.062; 257/E23.067

(58) Field of Classification Search .......... 257/431, 257/432, 434, 435, 678, 685, 686, 698, 777, 257/E25.005, E25.006, E25.021, E25.027, 257/E23.085
See application file for complete search history.

(56) References Cited

U.S. PATENT DOCUMENTS

2008/0001240 A1* 1/2008 Minamio et al. ............ 257/434
* cited by examiner

*Primary Examiner*—Jasmine J Clark
(74) *Attorney, Agent, or Firm*—Rosenberg, Klein & Lee

(57) ABSTRACT

An image-sensing chip package module adapted to dual-side soldering includes three substrates, an image-sensing chip and a filter lens. The three substrates are stacked together by pressing (using adhesive as adhesion medium), and the image-sensing chip is electrically connected to the top side of the top substrate and the bottom side of the bottom substrate via conductive bodies that are formed on inner surfaces of through holes passing through the three substrates. Hence, the image-sensing chip package module can use the conductive bodies formed on the bottom side of the bottom substrate (positive face electrical conduction) or the conductive bodies formed on the top side of the top substrate (negative face electrical conduction) to electrically connect with a main PCB. Furthermore, the filter lens is received and hidden in an opening of the top substrate in order to prevent the filter lens from being slid, collided and destroyed.

20 Claims, 5 Drawing Sheets

```
┌─────────────────────────────────────────────────────────────┐
│    providing a first board unit that has a first board, a plurality │
│ of first through holes passing through the first board, and a plurality │
│  of first conductive bodies respectively formed on inner surfaces of │
│  the first through holes and extended from the bottom ends of the inner │
│ surfaces of the first through holes to the bottom side of the first board │
└─────────────────────────────────────────────────────────────┘
                            │                            S100
                            ▼
        ┌──────────────────────────────────────────────┐
        │ arranging at least one image-sensing chip on the first board of │
        │  the first board unit in order to electrically connect the at │
        │  least one image-sensing chip with the first conductive bodies │
        └──────────────────────────────────────────────┘    S102
                            │
                            ▼
┌───────────────────────────────────────────────────────────────┐
│ arranging a second board unit on the first board unit via positioning │
│    and pressing, and the second board unit having a second board, a │
│    first opening for exposing the at least one image-sensing chip, │
│    a plurality of second through holes passing through the second │
│    board, and a plurality of second conductive bodies respectively │
│         formed on inner surfaces of the second through holes │
└───────────────────────────────────────────────────────────────┘    S104
                            │
                            ▼
┌───────────────────────────────────────────────────────────────┐
│       arranging a third board unit on the second board unit via │
│   positioning and pressing, and the third board unit having a third │
│ board, a second opening corresponding to the first opening, a plurality │
│   of third through holes passing through the third board, and a plurality │
│   of third conductive bodies respectively formed on inner surfaces of the │
│       third through holes and extended from the top ends of the inner │
│     surfaces of the third through holes to the top side of the first board │
└───────────────────────────────────────────────────────────────┘
                            │                            S106
                            ▼
        ┌──────────────────────────────────────────────┐
        │ filling a liquid package colloid into the first opening │
        └──────────────────────────────────────────────┘    S108
                            │
                            ▼
        ┌──────────────────────────────────────────────┐
        │ curing the liquid package colloid to form a solid package colloid │
        └──────────────────────────────────────────────┘    S110
                            │
                            ▼
        ┌──────────────────────────────────────────────┐
        │      receiving a filter lens in the second opening │
        └──────────────────────────────────────────────┘    S112
                            │
                            ▼
        ┌──────────────────────────────────────────────┐
        │        finishing the image-sensing chip package module │
        │       adapted to dual-side soldering by cutting process │
        └──────────────────────────────────────────────┘    S114
```

FIG. 2

IMAGE-SENSING CHIP PACKAGE MODULE ADAPTED TO DUAL-SIDE SOLDERING

BACKGROUND OF THE INVENTION

1. Field of the Invention

The present invention relates to a chip package module, and particularly relates to an image-sensing chip package module adapted to dual-side soldering.

2. Description of the Related Art

Referring to FIG. 1, the prior art provides an image-sensing chip package module adapted to single-side soldering, including: a PCB (Printed Circuit Board) 1a, two conductive trace layers 10a, an image-sensing chip S, a package colloid 2a and a filter lens 3a.

The two conductive trace layers 10a are formed around the PCB 1a, and the two conductive trace layers 10a are respectively extending from the top side of the PCB 1a to the bottom side of the PCB 1a. In addition, the image-sensing chip S is electrically connected to the two conductive trace layers 10a via two lead wires W.

The package colloid 2a is an epoxy material, and the package colloid 2a covers the image-sensing chip S for protecting the image-sensing chip S. In addition, the filter lens 3a is an IR-cutting filter, and the filter lens 3a is disposed on the package colloid 2a.

However, the image-sensing chip package module of the prior art has some defects as follows:

1. The image-sensing chip package module of the prior art is soldered onto a main PCB by single-side soldering. In other words, the image-sensing chip package module only can use its bottom side to electrically connect with the main PCB. Hence, single-side soldering limits the usage scope of the image-sensing chip package module.

2. The filter lens 3a is disposed on the package colloid 2a, so that the filter lens 3a cannot obtain any protection and is destroyed easily by external impacts.

3. The filter lens 3a is disposed loosely on the package colloid 2a, i.e. the filter lens 3a is not fixed tightly and can slide easily.

SUMMARY OF THE INVENTION

One particular aspect of the present invention is to provide an image-sensing chip package module adapted to dual-side soldering. The image-sensing chip package module includes three substrates, an image-sensing chip and a filter lens. The three substrates are stacked together by pressing (using adhesive as adhesion medium), and the image-sensing chip is electrically connected to the top side of the top substrate and the bottom side of the bottom substrate via conductive bodies that are formed on inner surfaces of through holes passing through the three substrates. Hence, the image-sensing chip package module can use the conductive bodies formed on the bottom side of the bottom substrate (positive face electrical conduction) or the conductive bodies formed on the top side of the top substrate (negative face electrical conduction) to electrically connect with a main PCB. Furthermore, the filter lens is received and hidden in an opening of the top substrate in order to prevent the filter lens from being slid, collided and destroyed.

In order to achieve the above-mentioned aspects, the present invention provides an image-sensing chip package module adapted to dual-side soldering, including: a first board unit, at least one image-sensing chip, a second board unit, a third board unit, a package colloid, and a filter lens.

The first board unit has a first board, a plurality of first through holes passing through the first board, and a plurality of first conductive bodies respectively formed on inner surfaces of the first through holes and extended from the bottom ends of the inner surfaces of the first through holes to the bottom side of the first board. The at least one image-sensing chip is disposed on the first board of the first board unit, and the at least one image-sensing chip is electrically connected to the first conductive bodies.

The second board unit is disposed on the first board unit. The second board unit has a second board, a first opening for exposing the at least one image-sensing chip, a plurality of second through holes passing through the second board, and a plurality of second conductive bodies respectively formed on inner surfaces of the second through holes. The second through holes correspond to the first through holes, and the second conductive bodies are respectively and electrically connected with the first conductive bodies.

The third board unit is disposed on the second board unit. The third board unit has a third board, a second opening corresponding to the first opening, a plurality of third through holes passing through the third board, and a plurality of third conductive bodies respectively formed on inner surfaces of the third through holes and extended from the top ends of the inner surfaces of the third through holes to the top side of the first board. The third through holes correspond to the second through holes, and the third conductive bodies are respectively and electrically connected with the second conductive bodies. The package colloid is filled into the first opening, and the filter lens is received in the second opening.

In order to achieve the above-mentioned aspects, the present invention provides an image-sensing chip package module adapted to dual-side soldering, including: a first board unit, at least one image-sensing chip, a second board unit, a third board unit, a package colloid, and a filter lens.

The first board unit has a first board, a plurality of first grooves passing along the edge of the first board, and a plurality of first conductive bodies respectively formed on inner surfaces of the first grooves and extended from the bottom ends of the inner surfaces of the first grooves to the bottom side of the first board. The at least one image-sensing chip is disposed on the first board of the first board unit, and the at least one image-sensing chip is electrically connected to the first conductive bodies.

The second board unit is disposed on the first board unit. The second board unit has a second board, a first opening for exposing the at least one image-sensing chip, a plurality of second grooves passing along the edge of the second board, and a plurality of second conductive bodies respectively formed on inner surfaces of the second grooves. The second grooves correspond to the first grooves, and the second conductive bodies are respectively and electrically connected with the first conductive bodies.

The third board unit is disposed on the second board unit. The third board unit has a third board, a second opening corresponding to the first opening, a plurality of third grooves passing along the edge of the third board, and a plurality of third conductive bodies respectively formed on inner surfaces of the third grooves and extended from the top ends of the inner surfaces of the third grooves to the top side of the first board. The third grooves correspond to the second grooves, and the third conductive bodies are respectively and electrically connected with the second conductive bodies. The package colloid is filled into the first opening, and the filter lens is received in the second opening.

Therefore, the present invention has some advantages, as follows:

1. Each first conductive bodes in the first board, each second conductive bodes in the second board and each third conductive bodes in the third board are electrically connected to each other, so that the image-sensing chip package module is soldered onto a main PCB by dual-side soldering. In other words, the image-sensing chip package module can use positive face or negative face to electrically connect with the main PCB.

2. The filter lens is received in the second opening of the third board. Hence, the third board can prevent the filter lens from being destroyed by external impacts.

3. The filter lens is received in the second opening of the third board. Hence, the third board can limit the position of the filter lens and prevent the filter lens from being slid and collided.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 2 is a flowchart of an image-sensing chip package module adapted to dual-side soldering according to the present invention;

DETAILED DESCRIPTION OF THE PREFERRED EMBODIMENTS

Figure 1:
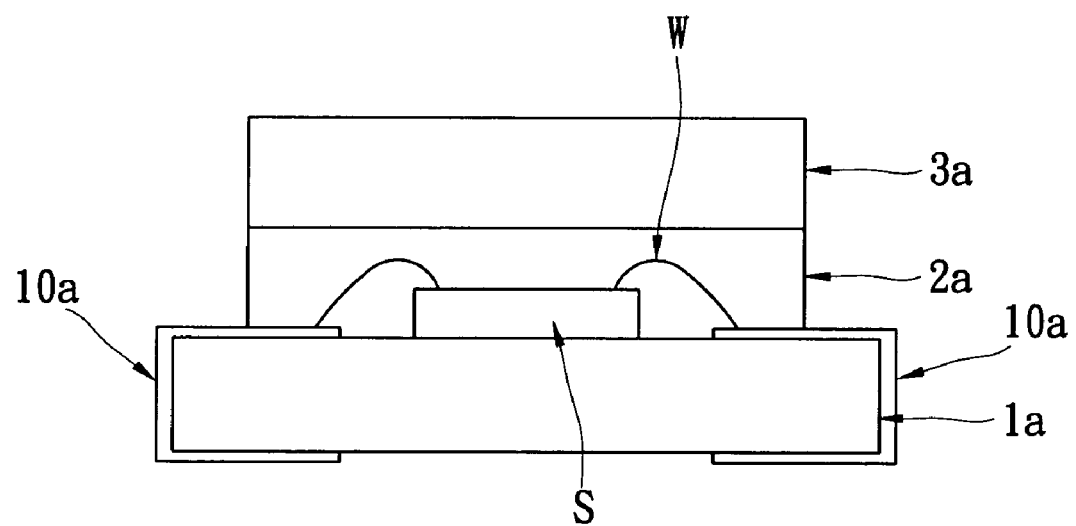
FIG. 1 is a side, schematic view of an image-sensing chip package module adapted to single-side soldering according to the prior art.
Figure 3A:
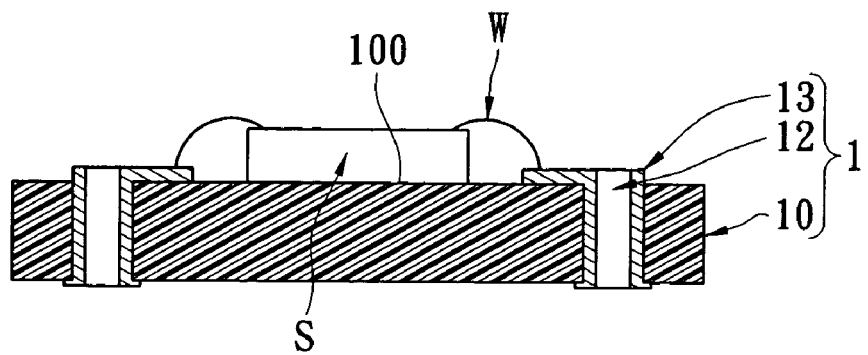
FIGS. 3A to 3F are cross-sectional views of a method for making an image-sensing chip package module adapted to dual-side soldering according to the present invention, at different stages of the packaging processes, respectively.
Figure 4:
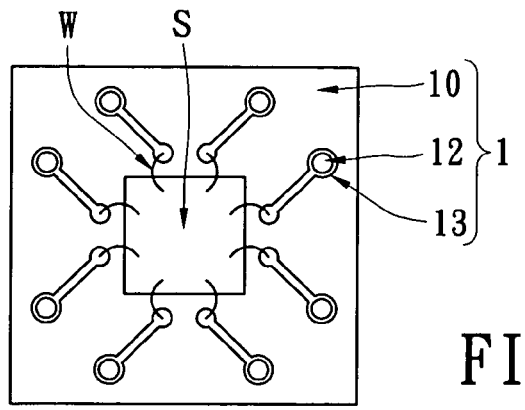
FIG. 4 is a top view of a match of an image-sensing chip and a first board unit according to the present invention.

Referring to FIGS. 2 and 3A to 3F, the present invention provides a method for making an image-sensing chip package module adapted to dual-side soldering, including as follows:

Step S100 is: referring to FIGS. 3A and 4, providing a first board unit 1 that has a first board 10, a plurality of first through holes 12 passing through the first board 10, and a plurality of first conductive bodies 13 respectively formed on inner surfaces of the first through holes 12 and extended from the bottom ends of the inner surfaces of the first through holes 12 to the bottom side of the first board 10. In addition, the first board 10 can be a BT (Bismaleimide Triazine) substrate.

Step S102 is: referring to FIGS. 3A and 4, arranging at least one image-sensing chip S on the first board 10 of the first board unit 1 in order to electrically connect the at least one image-sensing chip S with the first conductive bodies 13.

Furthermore, the first board 10 has a chip carrying area 100, and the at least one image-sensing chip S is disposed on the chip carrying area 100 of the first board 10. In addition, the first through holes 12 are distributively disposed around the center of the first board 10. The at least one image-sensing chip S is electrically connected to the first conductive bodies 13 via a plurality of lead wires W or a plurality of solder balls (not shown in Figures).

Figure 3B:
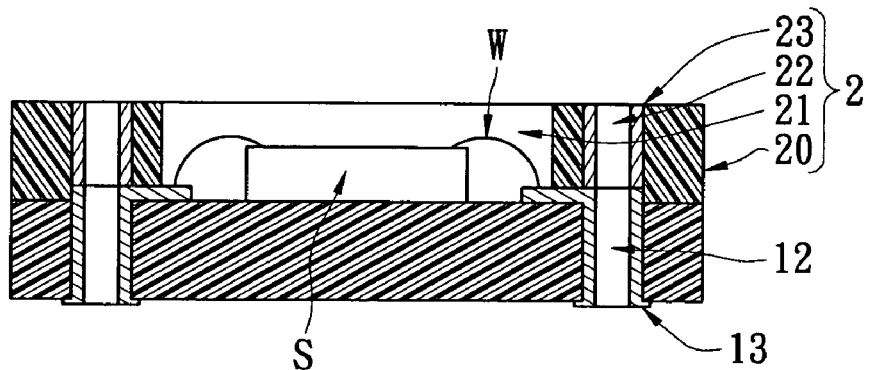
Figure 5:
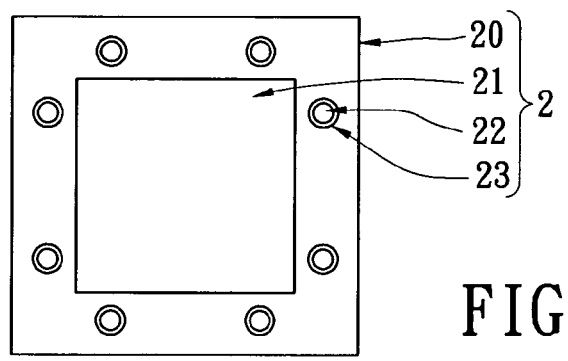
FIG. 5 is a top view of a second board unit according to the present invention.

Step S104 is: referring to FIGS. 3B and 5, arranging a second board unit 2 on the first board unit 1 via positioning and pressing, and the second board unit 2 having a second board 20, a first opening 21 for exposing the at least one image-sensing chip S, a plurality of second through holes 22 passing through the second board 20, and a plurality of second conductive bodies 23 respectively formed on inner surfaces of the second through holes 22. In addition, the second board 20 can be a BT (Bismaleimide Triazine) substrate.

Furthermore, the second through holes 22 correspond to the first through holes 12, and the second conductive bodies 23 are respectively and electrically connected with the first conductive bodies 13. In addition, the first opening 21 is used to expose both the at least one image-sensing chip S and the lead wires W.

Figure 3C:
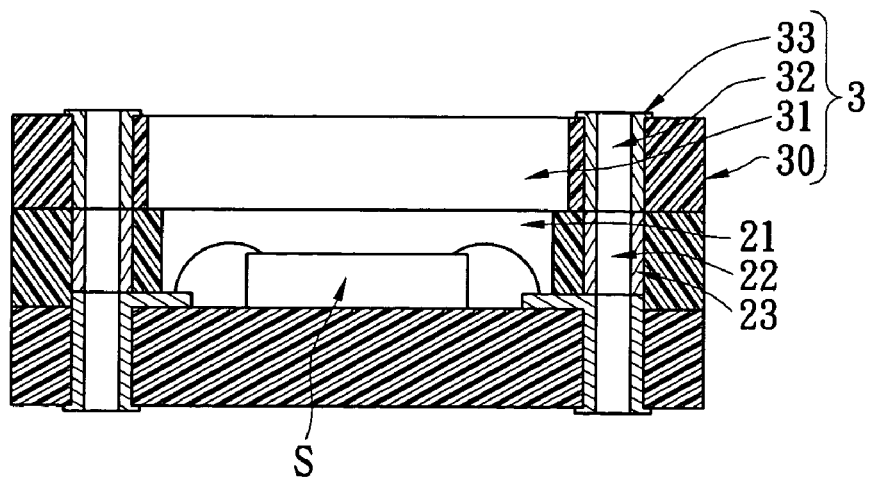
Figure 6:
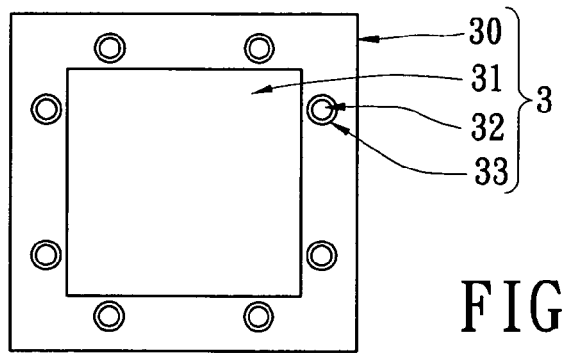
FIG. 6 is a top view of a third board unit according to the present invention.

Step S106 is: referring to FIGS. 3C and 6, arranging a third board unit 3 on the second board unit 2 via positioning and pressing, and the third board unit 3 having a third board 30, a second opening 31 corresponding to the first opening 21, a plurality of third through holes 32 passing through the third board 30, and a plurality of third conductive bodies 33 respectively formed on inner surfaces of the third through holes 32 and extended from the top ends of the inner surfaces of the third through holes 32 to the top side of the first board 10. In addition, the third board 30 can be a BT (Bismaleimide Triazine) substrate.

Furthermore, the third through holes 32 correspond to the second through holes 22, and the third conductive bodies 33 are respectively and electrically connected with the second conductive bodies 23. In addition, the size of the second opening 31 is larger than the size of the first opening 21, and the first opening 21 and the second opening 31 are square openings or openings of any shape adapted to the shape of the at least one image-sensing chip S for receiving the at least one image-sensing chip S.

Figure 3D:
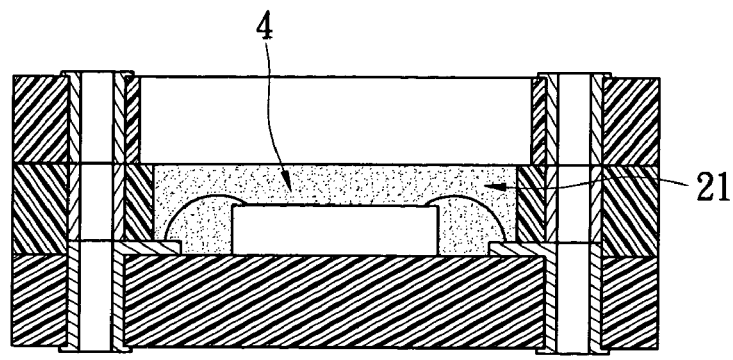

Step S108 is: referring to FIG. 3D, filling a liquid package colloid 4 into the first opening 21.

Step S110 is: curing the liquid package colloid 4 to form a solid package colloid 4'.

Figure 3E:
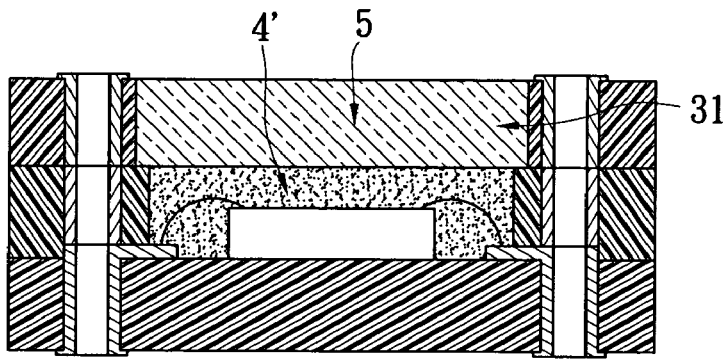

Step S112 is: referring to FIG. 3E, receiving a filter lens 5 in the second opening 31.

Figure 3F:
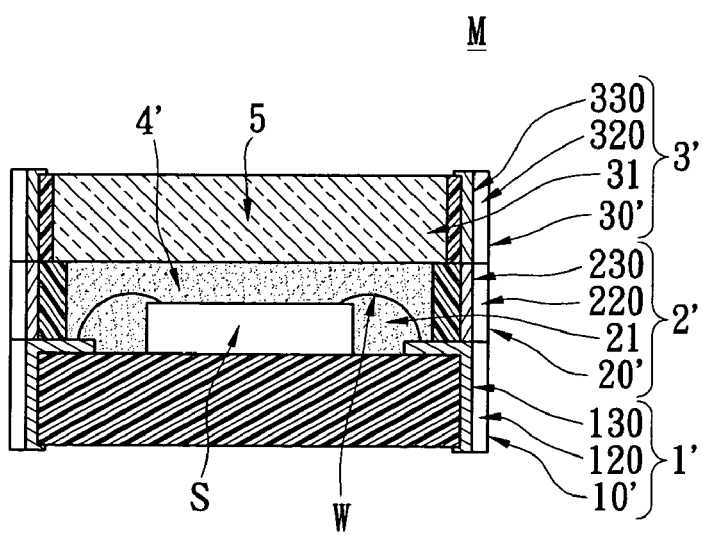
Figure 7:
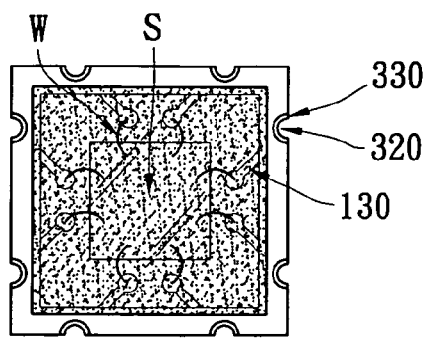
FIG. 7 is a top view of an image-sensing chip package module adapted to dual-side soldering according to the present invention.

Step S114 is: referring to FIGS. 3F and 7, finishing the image-sensing chip package module M adapted to dual-side soldering by cutting process.

Furthermore, the liquid package colloid 4 can be an epoxy material, and the filter lens 5 can be an IR-cutting filter. The height of the package colloid 4' is smaller than or equal to the height of the second opening 21 in order to receive the filter lens 5. The height of the filter lens 5 is smaller than or equal to the height of the second opening 31 in order to prevent the filter lens 5 from being destroyed by external impacts.

Referring to FIGS. 3F and 7, the present invention provides an image-sensing chip package module M adapted to dual-side soldering, including: a first board unit 1', at least one image-sensing chip S, a second board unit 2', a third board unit 3', a package colloid 4', and a filter lens 5.

The first board unit 1' has a first board 10', a plurality of first grooves 120 passing along the edge of the first board 10', and a plurality of first conductive bodies 130 respectively formed on inner surfaces of the first grooves 120 and extended from the bottom ends of the inner surfaces of the first grooves 120 to the bottom side of the first board 10'. In addition, the at least one image-sensing chip S is disposed on the first board 10' of the first board unit 1', and the at least one image-sensing chip S is electrically connected to the first conductive bodies 130.

Moreover, the second board unit 2' is disposed on the first board unit 1'. The second board unit 2' has a second board 20', a first opening 21 for exposing the at least one image-sensing chip S, a plurality of second grooves 220 passing along the edge of the second board 20', and a plurality of second conductive bodies 230 respectively formed on inner surfaces of the second grooves 220. The second grooves 220 correspond to the first grooves 120, and the second conductive bodies 230 are respectively and electrically connected with the first conductive bodies 130.

Furthermore, the third board unit 3' is disposed on the second board unit 2'. The third board unit 3' has a third board 30', a second opening 31 corresponding to the first opening 21, a plurality of third grooves 320 passing along the edge of the third board 30', and a plurality of third conductive bodies 330 respectively formed on inner surfaces of the third grooves 320 and extended from the top ends of the inner surfaces of the third grooves 320 to the top side of the first board 10'. The third grooves 320 correspond to the second grooves 220, and the third conductive bodies 330 are respectively and electrically connected with the second conductive bodies 230.

In conclusion, the present invention has some advantages, as follows:

1. Each first conductive bodes 130 in the first board 10', each second conductive bodes 230 in the second board 20' and each third conductive bodes 330 in the third board 30' are electrically connected to each other, so that the image-sensing chip package module M is soldered onto a main PCB (not shown) by dual-side soldering. In other words, the image-sensing chip package module M can use positive face or negative face to electrically connect with the main PCB.

2. The filter lens 5 is received in the second opening 31 of the third board 30'. Hence, the third board 30' can prevent the filter lens 5 from being destroyed by external impacts.

3. The filter lens 5 is received in the second opening 31 of the third board 30'. Hence, the third board 30' can limit the position of the filter lens 5 and prevent the filter lens 5 from being slid and collided.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An image-sensing chip package module adapted to dual-side soldering, comprising:
   a first board unit having a first board, a plurality of first through holes passing through the first board, and a plurality of first conductive bodies respectively formed on inner surfaces of the first through holes and extended from the bottom ends of the inner surfaces of the first through holes to the bottom side of the first board;
   at least one image-sensing chip disposed on the first board of the first board unit, wherein the at least one image-sensing chip is electrically connected to the first conductive bodies;
   a second board unit disposed on the first board unit, and the second board unit having a second board, a first opening for exposing the at least one image-sensing chip, a plurality of second through holes passing through the second board, and a plurality of second conductive bodies respectively formed on inner surfaces of the second through holes, wherein the second through holes correspond to the first through holes, and the second conductive bodies are respectively and electrically connected with the first conductive bodies;
   a third board unit disposed on the second board unit, and the third board unit having a third board, a second opening corresponding to the first opening, a plurality of third through holes passing through the third board, and a plurality of third conductive bodies respectively formed on inner surfaces of the third through holes and extended from the top ends of the inner surfaces of the third through holes to the top side of the first board, wherein the third through holes correspond to the second through holes, and the third conductive bodies are respectively and electrically connected with the second conductive bodies;
   a package colloid filled into the first opening; and
   a filter lens received in the second opening.

2. The image-sensing chip package module as claimed in claim 1, wherein the first board has a chip carrying area, and the at least one image-sensing chip is disposed on the chip carrying area of the first board.

3. The image-sensing chip package module as claimed in claim 1, wherein the first through holes are distributively disposed around the center of the first board.

4. The image-sensing chip package module as claimed in claim 1, wherein the at least one image-sensing chip is electrically connected to the first conductive bodies via a plurality of lead wires.

5. The image-sensing chip package module as claimed in claim 4, wherein the first opening exposes the lead wires.

6. The image-sensing chip package module as claimed in claim 1, wherein the at least one image-sensing chip is electrically connected to the first conductive bodies via a plurality of solder balls.

7. The image-sensing chip package module as claimed in claim 1, wherein the size of the second opening is larger than the size of the first opening.

8. The image-sensing chip package module as claimed in claim 1, wherein the first opening and the second opening are square openings.

9. The image-sensing chip package module as claimed in claim 1, wherein the height of the package colloid is smaller than or equal to the height of the second opening.

10. The image-sensing chip package module as claimed in claim 1, wherein the height of the filter lens is smaller than or equal to the height of the second opening.

11. An image-sensing chip package module adapted to dual-side soldering, comprising:
    a first board unit having a first board, a plurality of first grooves passing along the edge of the first board, and a plurality of first conductive bodies respectively formed on inner surfaces of the first grooves and extended from the bottom ends of the inner surfaces of the first grooves to the bottom side of the first board;

at least one image-sensing chip disposed on the first board of the first board unit, wherein the at least one image-sensing chip is electrically connected to the first conductive bodies;

a second board unit disposed on the first board unit, and the second board unit having a second board, a first opening for exposing the at least one image-sensing chip, a plurality of second grooves passing along the edge of the second board, and a plurality of second conductive bodies respectively formed on inner surfaces of the second grooves, wherein the second grooves correspond to the first grooves, and the second conductive bodies are respectively and electrically connected with the first conductive bodies;

a third board unit disposed on the second board unit, and the third board unit having a third board, a second opening corresponding to the first opening, a plurality of third grooves passing along the edge of the third board, and a plurality of third conductive bodies respectively formed on inner surfaces of the third grooves and extended from the top ends of the inner surfaces of the third grooves to the top side of the first board, wherein the third grooves correspond to the second grooves, and the third conductive bodies are respectively and electrically connected with the second conductive bodies;

a package colloid filled into the first opening; and a filter lens received in the second opening.

12. The image-sensing chip package module as claimed in claim 11, wherein the first board has a chip carrying area, and the at least one image-sensing chip is disposed on the chip carrying area of the first board.

13. The image-sensing chip package module as claimed in claim 11, wherein the first grooves are distributively disposed around the center of the first board.

14. The image-sensing chip package module as claimed in claim 11, wherein the at least one image-sensing chip is electrically connected to the first conductive bodies via a plurality of lead wires.

15. The image-sensing chip package module as claimed in claim 14, wherein the first opening exposes the lead wires.

16. The image-sensing chip package module as claimed in claim 11, wherein the at least one image-sensing chip is electrically connected to the first conductive bodies via a plurality of solder balls.

17. The image-sensing chip package module as claimed in claim 11, wherein the size of the second opening is larger than the size of the first opening.

18. The image-sensing chip package module as claimed in claim 11, wherein the first opening and the second opening are square openings.

19. The image-sensing chip package module as claimed in claim 11, wherein the height of the package colloid is smaller than or equal to the height of the second opening.

20. The image-sensing chip package module as claimed in claim 11, wherein the height of the filter lens is smaller than or equal to the height of the second opening.

* * * * *